US010192004B2

(12) United States Patent
Hopper

(10) Patent No.: US 10,192,004 B2
(45) Date of Patent: Jan. 29, 2019

(54) ESTIMATION OF THREE-DIMENSIONAL MODELS OF ROOFS FROM SPATIAL TWO-DIMENSIONAL GRAPHS

(71) Applicant: Aurora Solar Inc., San Francisco, CA (US)

(72) Inventor: Christopher Hopper, Menlo Park, CA (US)

(73) Assignee: Aurora Solar Inc., San Francisco, CA (US)

( * ) Notice: Subject to any disclaimer, the term of this patent is extended or adjusted under 35 U.S.C. 154(b) by 415 days.

(21) Appl. No.: 14/705,902

(22) Filed: May 6, 2015

(65) Prior Publication Data

US 2015/0234947 A1    Aug. 20, 2015

Related U.S. Application Data

(63) Continuation-in-part of application No. 14/532,814, filed on Nov. 4, 2014.

(60) Provisional application No. 61/899,806, filed on Nov. 4, 2013.

(51) Int. Cl.
*G06F 17/50* (2006.01)
*G06K 9/00* (2006.01)
*G06K 9/46* (2006.01)
*G06T 17/00* (2006.01)
*G06T 17/05* (2011.01)

(52) U.S. Cl.
CPC ..... *G06F 17/5004* (2013.01); *G06K 9/00637* (2013.01); *G06K 9/00912* (2013.01); *G06K 9/4638* (2013.01); *G06T 17/005* (2013.01); *G06T 17/05* (2013.01)

(58) Field of Classification Search
CPC ... G06F 17/5004; G06F 17/50; G06T 17/005; G06T 17/05; G06K 9/00912; G06K 9/00637; G06K 9/4638
USPC ........................................................... 703/1
See application file for complete search history.

(56) References Cited

U.S. PATENT DOCUMENTS

| | | | | |
|---|---|---|---|---|
| 6,108,446 A | * | 8/2000 | Hoshen | G06K 9/6218 382/203 |
| 7,305,983 B1 | | 12/2007 | Meder | |
| 2009/0132210 A1 | | 5/2009 | Royan et al. | |
| 2011/0191069 A1 | | 8/2011 | Madsen | |
| 2011/0205245 A1 | * | 8/2011 | Kennedy | F24J 2/40 345/636 |

(Continued)

FOREIGN PATENT DOCUMENTS

KR   10-2009-0038127 A    4/2009

OTHER PUBLICATIONS

Bertan, Emre et al., "Automatic 3D Roof Reconstruction using Digital Cadastral Map, Architectural Knowledge and an Aerial Image", 2006, IEEE.*

(Continued)

*Primary Examiner* — Cedric Johnson
(74) *Attorney, Agent, or Firm* — Fenwick & West LLP

(57) ABSTRACT

Systems and methods construct three-dimensional models of building structures with roofs by exploiting properties of the projection of a three-dimensional building structure onto the ground. This projection is a two-dimensional spatial graph, which can be constructed for example by a user or by an image recognition algorithm. The spatial graph is processed to recreate a three-dimensional model of the building structure.

20 Claims, 6 Drawing Sheets

(56) References Cited

U.S. PATENT DOCUMENTS

| | | | |
|---|---|---|---|
| 2012/0101783 A1* | 4/2012 | Stephens | G06F 17/5004 703/1 |
| 2013/0191082 A1* | 7/2013 | Barthelet | G06K 9/00637 703/1 |
| 2013/0321392 A1* | 12/2013 | van der Merwe | G01C 21/20 345/419 |

OTHER PUBLICATIONS

Forlani, Gianfranco et al. "Complete Classification of Raw LIDAR Data and 3D Reconstruction of Buildings", Jan. 10, 2006, Pattern Analysis Applic., Springer-Verlag London. (Year: 2006).*

Laycock, R.G. et al., "Automatically Generating Large Urban Environments based on the Footprint Data of Buildings", Jun. 16-20, 2003, SM'03, ACM. (Year: 2003).*

Lee et al., "Extraction of 3D Building Information using Shadow Analysis from Single High Resolution Satellite Images", *Journal of the Korean Society for GeoSpatial Information System*, vol. 14, No. 36, pp. 3-13, Jun. 2006. URL <http://scholar.ndsl.kr/schDetail.do?cn=JAK02006109123279 12>.

PCT International Search Report and Written Opinion, PCT Application No. PCT/US2014/063934, dated Feb. 2, 2015, ten pages.

Woo et al., "Reconstruction of 3D Building Model from Satellite Imagery Based on the Grouping of 3D Line Segments Using Centroid Neural Network", Korean Journal of Remote Sensing, vol. 27, No. 2, pp. 121-130, 2011, URL<http://scholar.ndsl.kr/schDetail.do?cn=JAK201121538714207> (with English abstract).

Betran, E. et al., "Automatic 3D Roof Reconstruction using Digital Cadastral Map, Architectural Knowledge and an Aerial Image," IEEE, 2006, pp. 1407-1410.

United States Office Action, U.S. Appl. No. 14/532,814, dated Dec. 16, 2016, twenty-three pages.

Haala, N., et al., "Acquisition of 3D urban models by analysis of aerial images, digital surface models and existing 2D building information," Proceedings of SPIE, Apr. 2001, 12 Pages.

Wang, Q., et al., "A Grammatical Framework for Building Rooftop Extraction," IGARSS, 2009, IEEE, pp. 334-337.

Office Action for U.S. Appl. No. 14/532,814, dated Aug. 25, 2017, 26 Pages.

\* cited by examiner

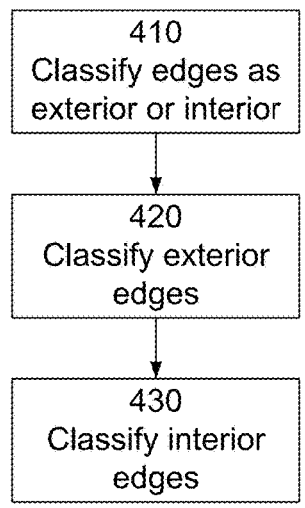
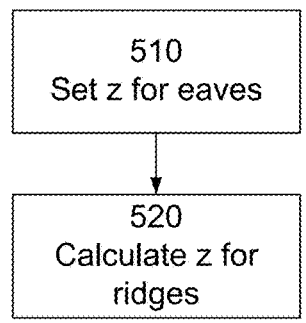
FIG. 4
FIG. 5
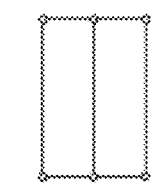
FIG. 6A
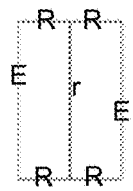
FIG. 6B
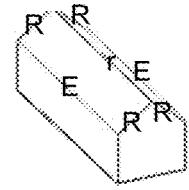
FIG. 6C
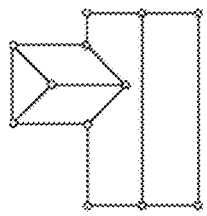
FIG. 7A
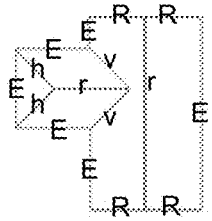
FIG. 7B
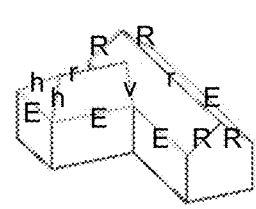
FIG. 7C
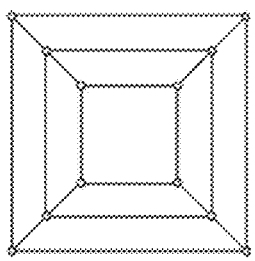
FIG. 8A
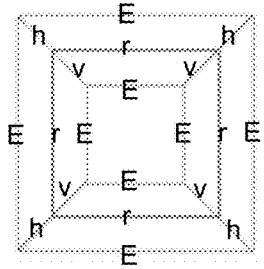
FIG. 8B
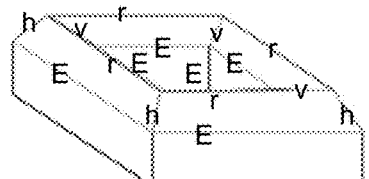
FIG. 8C

ESTIMATION OF THREE-DIMENSIONAL MODELS OF ROOFS FROM SPATIAL TWO-DIMENSIONAL GRAPHS

CROSS-REFERENCE TO RELATED APPLICATION(S)

This application is a continuation-in-part of and claims the benefit of U.S. patent application Ser. No. 14/532,814, "Estimation of Three-Dimensional Models of Roofs from Spatial Two-Dimensional Graphs", filed Nov. 4, 2014, which claims priority of U.S. Provisional Patent Application Ser. No. 61/899,806, "Estimation of 3D Models of Buildings from Spatial 2D Graph," filed Nov. 4, 2013. The subject matter of all of the foregoing is incorporated herein by reference in their entirety.

BACKGROUND OF THE INVENTION

1. Field of the Invention

The invention relates generally to the construction of three-dimensional representations of building structures such as roofs, based on two-dimensional spatial graphs of the structures, for example which can be directly user-specified or based off satellite imagery.

2. Description of the Related Art

There are several use cases in which the estimation of three-dimensional building structures, for example from satellite imagery, is useful. One of them is for the remote analysis and design of solar installations and in particular shading analysis. Current solutions usually do not fully represent the three-dimensional structure of buildings and are thus limited in their scope and application.

Thus, there is a need for better approaches to create a good estimate of the three-dimensional structure of a building.

SUMMARY OF THE INVENTION

The present invention overcomes the limitations of the prior art by exploiting properties of the projection of a three-dimensional building structure (such as a roof) onto the ground. This projection is a two-dimensional spatial graph, which can be constructed for example by a user or by an image recognition algorithm. The spatial graph is processed to recreate a three-dimensional model of the building structure.

BRIEF DESCRIPTION OF THE DRAWINGS

The invention has other advantages and features, which will be more readily apparent from the following detailed description of the invention and the appended claims, when taken in conjunction with the accompanying drawings, in which:

FIG. 4 is a flow diagram of an example method for classifying edge types.

FIG. 5 is a flow diagram of an example method for calculating heights.

FIG. 6A is a two-dimensional spatial graph of a roof, FIG. 6B shows the edge types assigned for the roof, and FIG. 6C shows the three-dimensional model reconstructed for the roof from the edge types.

FIG. 7A is a two-dimensional spatial graph of a roof, FIG. 7B shows the edge types assigned for the roof, and FIG. 7C shows the three-dimensional model reconstructed for the roof from the edge types.

FIG. 8A is a two-dimensional spatial graph of a roof, FIG. 8B shows the edge types assigned for the roof, and FIG. 8C shows the three-dimensional model reconstructed for the roof from the edge types.

DETAILED DESCRIPTION OF THE PREFERRED EMBODIMENTS

One aspect is the creation of estimates of three-dimensional building structures, such as roofs, based on two-dimensional graphs of the structures. These graphs could be user defined or the output of an image recognition algorithm (such as edge detection). In one implementation, in order to simplify the creation of a graph by the user for a given building, an interface is provided in which the user can create this graph as an overlay on a satellite image of the building.

Figure 1:
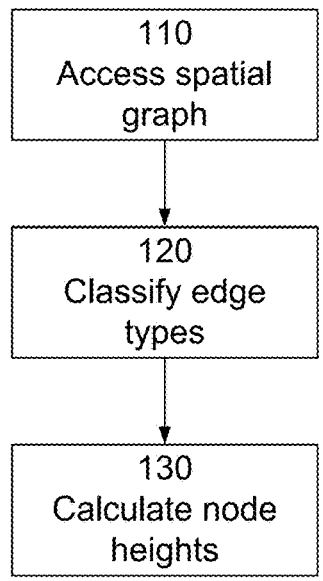
FIG. 1 is a flow diagram of an example method for constructing three-dimensional models of a roof.

FIG. 1 is a flow diagram of an example method for constructing three-dimensional models of a roof. The three-dimensional model is constructed by accessing 110 a two-dimensional spatial graph of the roof. The two dimensional graph is a representation of the top view of the roof. It is a projection of the roof onto the x-y plane, i.e., collapsing the height (z) coordinate. The (spatial) graph includes nodes and edges connecting these nodes. Each edge of the spatial graph represents a physical edge of the roof. Each node is where two or more edges meet. Note that the relative spatial position of the nodes (i.e., x and y coordinates) is preserved. That is, the spatial graph is drawn to scale with respect to a top view of the roof.

Figure 2A:
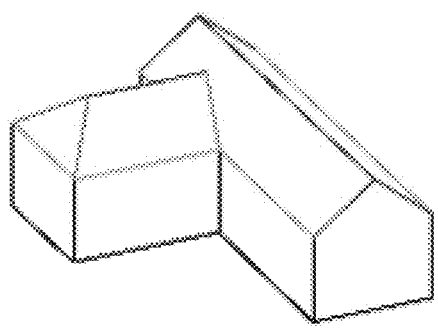
FIG. 2A is a perspective view of a building with a roof.
Figure 2B:
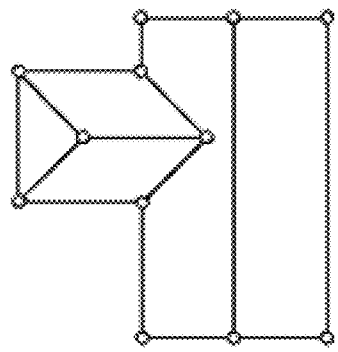
FIG. 2B is a corresponding two-dimensional spatial graph for the roof.

FIGS. 2A-B illustrate an example of this. FIG. 2A is a perspective view of a building with a roof FIG. 2B is the corresponding two-dimensional spatial graph. Each line in FIG. 2B is an edge of the graph, and each circle is a node of the graph. Each edge connects two nodes, which will be referred to as the end nodes of that edge. The edges that connect to a common node will be referred to as neighboring edges.

The two-dimensional spatial graph defines a number of polygons, where edges of the graph are sides of the polygon and nodes of the graph are vertices of the polygon. These polygons represent roof faces. In the example of FIG. 2B, there are five such polygons or roof faces. Each roof face is characterized by a tilt, which can be defined by a tilt direction (i.e., the direction of steepest ascent/descent) and a pitch (the rate of ascent/descent along the tilt direction). Alternatively, roof faces can be characterized by a normal to the roof face, which is a three-dimensional vector with x, y and z components. The projection of the normal onto the horizontal plane will be referred to as the azimuth. Typically the azimuth is normalized to a unit vector and defined as the number of degrees away from a reference. For example, the reference may be the unit vector pointing north and the azimuth may be defined by the number of degrees (clockwise) away from true north.

The two-dimensional spatial graph can be generated in different ways and from various sources. In one approach, the spatial graph is generated from satellite imagery, which provides a top view of the roof. For example, a human could create the spatial graph by tracing the top view from the satellite image. Another way of generating the spatial graph, for example, is via a computer-vision algorithm.

Returning to FIG. 1, the edges in the two-dimensional spatial graph are classified 120 as different edge types based on the topology of the spatial graph. Several different examples of this will be given below. The heights of the nodes are calculated 130 based on the edge types. Given the node heights, a three-dimensional model of the roof can be constructed.

In one approach, depending on the specific application, a set of assumptions around how the spatial graph represents a two-dimensional projection of the three-dimensional structure can be made. These assumptions can yield a predefined set of edge types, with properties or rules for different edge types. Processing the two-dimensional spatial graph according to these properties/rules then classifies each edge as to its edge type. Conversely, the properties/rules can also be used to check a classification for any inconsistency with the properties/rules.

FIGS. 3A-3B, 4-5, 6A-6C, 7A-7C, and 8A-8C show examples. In these simplified examples, the roofs are restricted to certain constructions. As a result, the edges can be classified as one of the following types: eave, rake, ridge, valley and hip. Each edge type is generally defined as follows:

Eave: This roof edge is part of the outline of the roof (i.e., it borders only one roof face), and the roof edge is generally level (i.e., both end nodes of the edge are at the same height).

Rake: This roof edge is part of the outline of the roof, and is not level.

Ridge: This roof edge is a level edge that is shared between roof faces.

Hip: This roof edge joins two roof faces in a delta (^) shape, but excluding ridges.

Valley: This roof edge joins two roof faces in a V-shape.

Figure 3A:
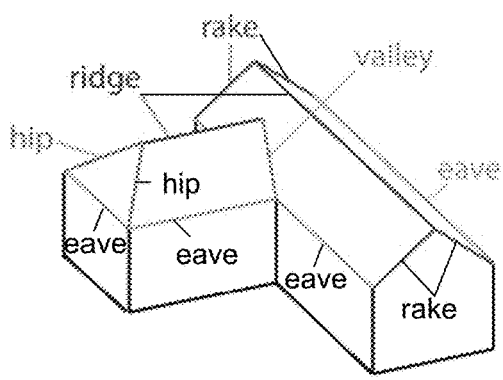
FIGS. 3A and 3B illustrate different edge types.
Figure 3B:
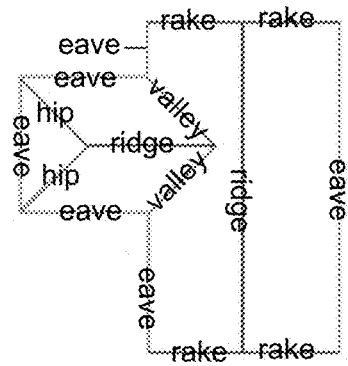

FIGS. 3A-B show the roof of FIGS. 2A-2B, where the roof edges have been labeled according to the edge type. For convenience, an edge that borders only one roof face will be referred to as a single edge or exterior edge. The collection of all exterior edges is the outline of the roof. Note that the outline may contain more than just the perimeter, for example if the building has an enclosed courtyard, as shown in FIG. 6A. An edge that borders two roof faces will be referred to as a shared edge or interior edge. In the definitions above, eaves and rakes are exterior edges, while ridges, hips and valleys are shared edges. Additionally, an edge where both end nodes are the same height will be referred to as a level edge. In this example, eaves and ridges are level edges.

One algorithm for classifying 120 edge types in a spatial graph is based on the following rules. These rules are simplified for purposes of illustration:

Rake: An exterior edge where, at one end node, it has a neighboring interior edge (a ridge) connecting to it at a 90° angle and it also has a neighboring collinear exterior edge.

Eave: Any exterior edge that is not a rake. That is, all exterior edges are classified as either rakes or eaves. OR An exterior edge that, at both of its end nodes, connects to a hip at a 45° angle or to a valley at a 135° angle, respectively.

Hip: An interior edge that, at both of its end nodes, connects to an exterior edge (eave or rake) at a 45° angle or connects to a ridge at a 135° angle.

Valley: An interior edge that, at both of its end nodes, connects to an exterior edge (eave or rake) at a 135° angle or connects to a ridge at a 45° angle.

Ridge: An interior edge that, at both of its end nodes, connects to hips or valleys or connects to an exterior edge at a 90° angle.

These rules are applied in order to determine the edge types. They can be applied in different orders. For example, FIG. 4 is a flow diagram showing one possible order. In this example, the edges are first classified 410 as interior or exterior edges, depending on whether they border one or two roof faces. The exterior edges are then classified 420 as eaves or rakes according to the rules above. The interior edges are then classified 430 as hips, valleys or ridges, according to the above rules. Furthermore the process can be extended to check the validity of the spatial graph, to check the edge type classifications and to highlight errors (for example by checking for edges that cross each other, or for edges that violate the rules above).

There are alternate ways of implementing the approach described above. Examples include machine-learning algorithms to detect edge types or letting the user or other sources determine some of the edge types.

The classified edges types are used to estimate 130 heights (z coordinates) of the nodes, thus completing the three-dimensional model since the x and y coordinates for each node are given by the spatial graph. In one approach, the calculations are based on a specified height for the base of the roof, tilts for each of the roof faces, and rules governing the different edge types. Continuing the simplified example, it is assumed that all eaves are located at the same height. This height could be specified by the user, for example by letting the user specify the number of stories in the building and multiplying this number with an average story height. It is also assumed that the tilt direction (fall line) is perpendicular to any eave or ridge.

FIG. 5 is a flow diagram of an example method for calculating heights. For the end nodes of eaves, the z value is set 510 to the building height (i.e., base height for the roof). If a ridge and an eave are borders to the same roof face, then the z values of the end nodes of the ridge are calculated 520 using an estimated pitch of the roof face and the distance from the ridge to the eave. The same approach can be used for ridges that border the same roof face, if the pitch of one of the roof faces is already known. Since a ridge borders two roof faces, this approach might result in conflicting values (for example if the two roof faces have different pitches, but are modeled as having the same pitch). The resulting discrepancy can be resolved in different ways, for example by taking an average of the two values, by selecting only one of the roof faces to calculate the z value, or by changing the roof pitches to produce a consistent result. An alternative approach is to use a numerical optimization algorithm that attempts to find a pitch for each roof face such that each of the tilts is close to one of a set of typical discrete roof pitches. The remaining edge types—rake, hip, valley—all connect to either eaves or ridges, so setting the z height for eaves and ridges will set the z height for all nodes in the spatial graph in this simplified example. From the resulting three-dimensional spatial graph, a full three-dimensional model can be constructed, including faces and textures if desired.

FIGS. 6A-C, 7A-C, and 8A-C are examples of two-dimensional spatial graphs processed as described above. FIGS. 6A, 7A, and 8A show the two-dimensional spatial graphs, FIGS. 6B, 7B, and 8B show the edge types assigned, and FIGS. 6C, 7C, and 8C show the three-dimensional models reconstructed from the edge types. In FIGS. 6B, 7B, and 8B, E and R stand for eave and rake, and r, v and h stand for ridge, valley and hip. In FIG. 8A, the middle square is identified on the spatial graph as not a roof face, indicating a central courtyard. If it were a roof face, a different roof shape would have been constructed.

Creating a three-dimensional representation of the roof allows for the further calculation of the azimuth (geographic orientation with respect to north, e.g. SE=135°) of roof faces. One way of doing this is taking the projection of the normal of the roof face onto the ground plane and calculating its angle relative to a vector pointing north. If using satellite imagery to create the graph, the absolute size of the three-dimensional structure can be determined from the scale of the imagery used to construct the graph.

FIGS. 3A-3B, 6A-6C, 7A-7C, and 8A-8C are simplified examples for purposes of illustration. Other variations will be apparent. For example, there may be additional edge types. One example is that rakes and eaves may not account for all edges in the roof outline. For example, a bay window or other structure may protrude from an exterior wall and the roof face will also extend to cover the bay window. This will produce edges on the outline (specifically, the two edges covering the sides of the bay window), which are neither rakes nor eaves. Another example is a level edge that is shared between two faces of a mansard roof, where it has a "bend."

Also, the example above assumed that all roof edges are oriented at multiples of 45°. This is not the case for all roofs. The rules above can be generalized to accommodate this. For example, the rule identifying an exterior edge as a rake required that the exterior edge connect to a neighboring collinear exterior edge. That is, the two exterior edges form an angle of 180° at the connecting node. This rule could be generalized to angles within some A of 180° or angles greater than some number, for example 135°, 150° or 165°. Similarly, the other angle requirements can also be generalized. For example, ridges might be required to connect at an angle between 45° and 135° rather than exactly at 90°. Hips might be required to connect at angles of less than 90° and more than 90°, rather than exactly at 45° and 135°. Valleys might be required to connect at angles of more than 90° and less than 90°, rather than exactly at 135° and 45°.

Figure 9:
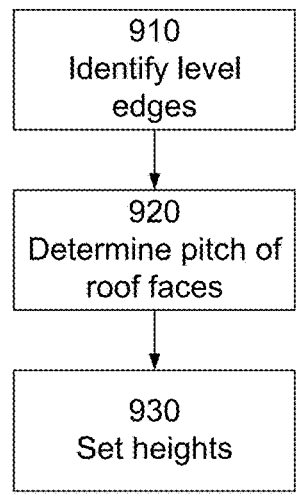
FIG. 9 is a flow diagram of another example method for constructing three-dimensional models of a roof.

The approach described above is just one possible classification into edge types. FIG. 9 is a flow diagram of an alternative approach based on level edges. In this alternative (or complementary) approach, the edge types include level edges and non-level edges. A level edge has the property that the z-coordinates of both of its end nodes have the same value. Level edges are parallel to the ground plane.

Level edges within the two-dimensional spatial graph are identified 910. This may be accomplished in a variety of ways. For example, eaves may be identified as described above and, by definition, all eaves are level edges. Alternately, level edges often have a characteristic that they are likely to appear as a set of parallel level edges, for example a number of parallel eaves and corresponding ridges. Therefore, the spatial graph can be analyzed for parallel edges and this parallelism can be used as a factor to determine level edges. Long exterior edges also tend to be level edges. Thus, the spatial graph can also be analyzed on this basis. For example, an edge in the spatial graph that (a) is a long exterior edge, (b) is parallel to a fair number of other edges, and (c) does not connect to interior edges or other exterior edges in a manner typical of rakes, is likely to be a level edge.

As another example, if two edges bordering a roof face are parallel and one edge is known to be a level edge, then the other parallel edge will also be a level edge. If the known level edge is an eave and the other edge is an interior edge, then it will be a ridge. If both are interior edges, then they will both be ridges.

Once the level edges have been classified, the pitches of roof faces can be determined 920, either explicitly or implicitly. Explicit setting of the pitch means that a pitch is directly assigned to a roof face, for example through user input or through an assumption. In one approach, a default pitch is based on the average roof pitch for a given area or for a certain style building. Implicit setting of the pitch means that the pitch for a roof face can be calculated from the height (z value) of one or more of its nodes.

Once level edges have been detected, the azimuth for each roof face can be determined by calculating the vector that satisfies the following properties:
1) It is approximately perpendicular to all level edges of the roof face; and
2) It points in the "outwards" direction for the roof face. That is, when added to the midpoint of a level edge for the roof face that lies on the outline of the roof, the resulting point is outside of the roof (i.e. not contained in any roof face). If the roof face does not have a level edge that lies on the outline of the roof, then the "outwards" direction can be defined as follows. We define the "roof face distance" of a roof face as the shortest number of faces that must be traversed from the current roof face in order to reach a roof face that contains an edge on the outline of the roof. Then, the azimuth of the current roof face is set to the azimuth of one of the adjacent roof faces with the lowest "roof face distance." If all adjacent roof faces have the same "roof face distance," it is likely a flat roof face and therefore it has a tilt of 0 and no defined azimuth.

The pitch and tilt direction together determine the tilt of a roof face. The tilt direction can be determined in a number of ways. One approach is based on determining the tilt axis for a roof face, which is defined as a line that is perpendicular to the tilt direction and which passes through the plane of the roof face. The roof face plane can be thought of as a plane that rotates about the tilt axis, where the final inclination is determined by the roof face's pitch.

To set the z values of nodes of a roof face, a tilt axis is determined. The tilt axis for each roof face can be determined, for example, by these rules:

If no z value of any node in the given roof face has been determined yet: One of the roof's level edges will serve as the tilt axis. If there is one level edge on the outline of the roof, pick the line that runs to this edge. If there are multiple such edges, pick the line that runs through the longest edge. If there are none, start with a roof face which has at least one roof edge which is part of the roof outline.

If the z value of exactly one node of the roof face has been defined: Construct a tilt axis that is normal to the azimuth for the roof face in the x-y plane and passes through the node with known z value and through the roof plane.

If more than one node's z-value has been set: Pick the one that best satisfies both of the previous rules.

The z values of the nodes in a given roof face can be set 930 according to the following principles. Traverse through all of the nodes of the roof face for which the z value has not yet been determined and set the z values for these nodes according to:

$$z = h + d \times p \quad (1)$$

where z is the height of the node, h is the height of the tilt axis, p is the pitch of the roof (expressed as rise over run), and d is the distance from the node to the tilt axis in the x-y plane. In addition, for every node that connects to a level edge, recursively propagate the z value of that node to the other nodes of the same level edge, thus ensuring that level edges stay level.

The tilt of a roof face can either be set explicitly (for example by user input, through the output of an image-recognition or another engine or through an assumption) or implicitly, when the z value of one (or more) of its nodes is set by an adjacent roof face. In the latter case, the pitch of a roof face may be inferred from node z values as follows:

If the z value of only one node of this roof face has been defined: Calculate the tilt of the roof face as follows:

$$\text{tilt} = \tan^{-1}(dz/d) \quad (2)$$

where dz=the difference in height between the node and the tilt axis d=the distance of the node to the tilt axis in the x-y-plane If the z value of two or more nodes of this roof face has been defined: Calculate the tilt of the roof face as follows:

1) Pick two of the nodes $N_0$ and $N_1$, where $N_0$ is lower than $N_1$.
2) Pick a tilt axis, which runs through the node $N_0$, lies in the plane of the roof face and is perpendicular to the azimuth of the roof face in the x-y plane.
3) Calculate the tilt of the roof face using Eq. (2).

This approach can be combined with an optimization strategy that finds an estimate to the roof structure by iterating roof face pitches to find a solution where every roof face pitch is close to one of an array of discrete, typical roof pitches.

The described steps also apply if parameters other than roof face tilts are adjusted. For example, if the z value of a node or of a level edge (and thus the z value of both of its nodes) is set, the above steps describe how this change affects the structure of the rest of the roof.

The above principles can be applied sequentially (and recursively), but not necessarily in the order listed above, to generate the three-dimensional roof structure of the building. For example, these principles may be applied by traversing from one roof face to the next adjacent roof face until the entire roof has been traversed. However, due to the fact that the tilt of one roof face can be affected by that of an adjacent roof face, any traversal preferably will keep track of which roof faces, edges and nodes have been solved in order to avoid recursion. Alternately, recursion can be used to identify or resolve inconsistencies. Calculation of z values of nodes can be performed separately from the detection and classification of the edge types.

The use of level edges can be used in combination with the additional edge types described previously. The edge type can also be determined based on how roof faces relate to each other. Rules for this could include:

1) Exterior edges that have the same z value (within A) for both end nodes are eaves.
2) Exterior edges that have different z values (by more than A) for both end nodes are rakes.
3) Shared edges that have the same z values (within A) for both end nodes are ridges.
4) Shared edges that have different z values (by more than A) for both end nodes are either hips or valleys. If the line segment connecting the two centroids of the two bordering roof faces is above the shared edge, then the shared edge is a valley. If below, then it is a hip.

In addition to determining the roof structure, additional three-dimensional objects around the building can be specified in a similar manner. For example, a tree can be specified by the user by drawing a circle next to the building graph (this could happen on a satellite image overlay) and by specifying an "object type" or "shape" property, which specifies how the tree can be approximated in three dimensions (for example a combination of a sphere and a cylinder or a combination of a cone and a cylinder), as well as additional parameters (e.g. tree trunk diameter, tree height and crown transparency). This approach can also be combined with LIDAR data to get more information on object heights and shapes, and to account for other objects in the vicinity.

Figure 10A:
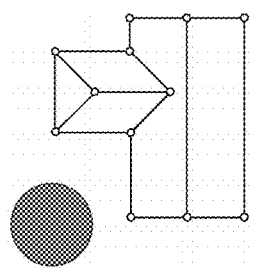
FIG. 10A is a two-dimensional spatial graph of a roof and an object.
Figure 10B:
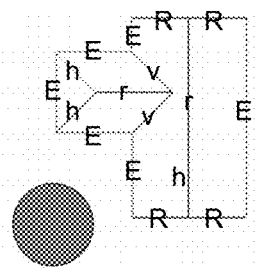
FIG. 10B shows the edge types assigned for the roof.
Figure 10C:
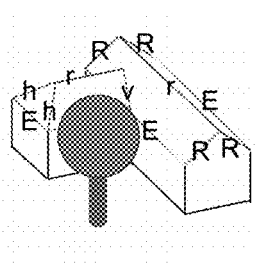
FIG. 10C shows the three-dimensional model reconstructed for the roof and for the object from the edge types for the roof.

FIGS. 10A-C illustrate how the estimated three-dimensional building structure can be combined with other approximated three-dimensional objects of its surrounding.

Analysis can be done based on the building structure and surrounding objects. An example for this would be shading analysis for solar photovoltaic systems based on a raycasting algorithm that calculates roof shading over a year.

If the spatial graph is based off satellite imagery, a texture for the faces of the three-dimensional model that represent the roof of the building can be automatically generated by cropping the satellite image based on the spatial graph. Complex building structures can be represented by combining separate, and possibly overlapping three-dimensional models.

Figure 11A:
FIG. 11A illustrates an example user interface to allow for the input of the two-dimensional spatial graph.

FIG. 11A illustrates a user interface to allow for the input of the two-dimensional spatial graph. In this case it is based on a satellite image to facilitate the construction of the graph.

Figure 11B:
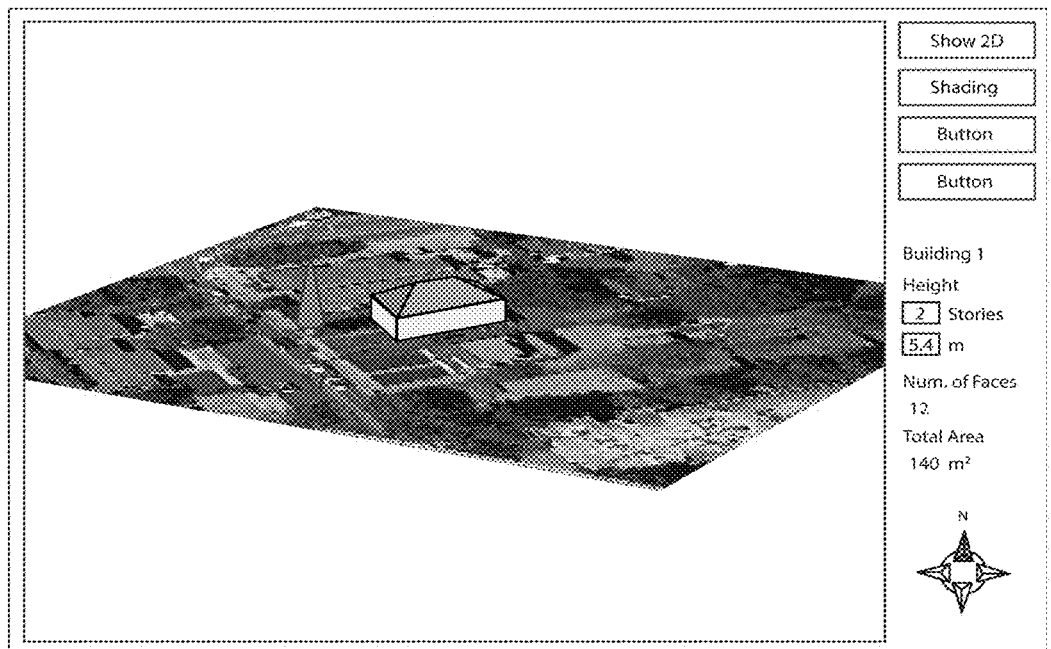
FIG. 11B illustrates an example user interface showing the three-dimensional model based on the two-dimensional spatial graph.

FIG. 11B illustrates a user interface showing a view with the three-dimensional model based on the two-dimensional graph. This demonstrates how the user could toggle between two-dimensional and three-dimensional views in order to visualize and inspect the results and to do further analysis on its output.

Figure 12A:
FIG. 12A illustrates a satellite image of a building structure with detected level edges for the roof.
Figure 12B:
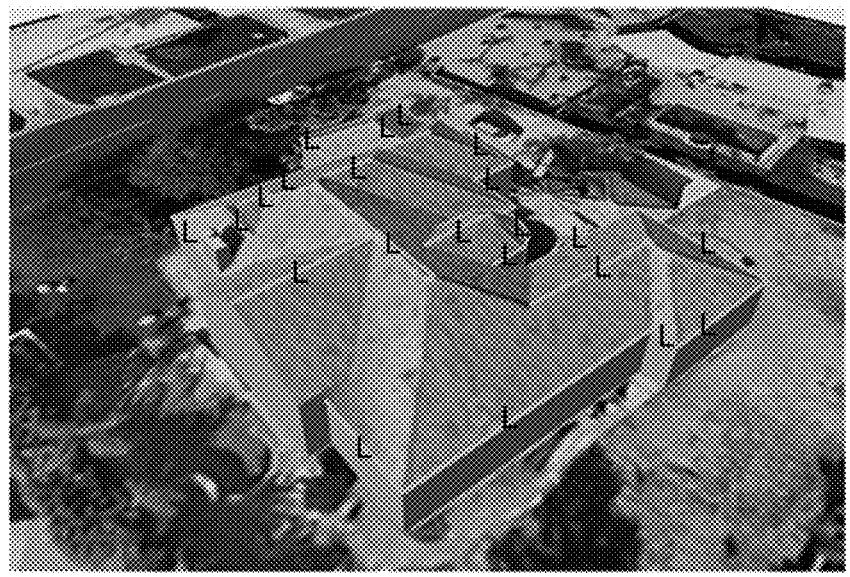
FIG. 12B illustrates the three-dimensional model reconstructed for the building structure of FIG. 12A.

FIG. 12A illustrates a satellite image of a building structure with detected level edges for the roof. FIG. 12A also shows a two-dimensional graph for the roof. FIG. 12B illustrates the three-dimensional model reconstructed for the building structure of FIG. 12A. As illustrated, the texture of the roof in FIG. 12A is applied to the roof of the three-dimensional model illustrated in FIG. 12B. The three-dimensional model reconstructed for the building is positioned in the image such that objects of its surrounding maintain the relative positions in the satellite image illustrated in FIG. 12A. When a user navigates the image to view the three-dimensional model for the building from different directions, the building's surrounding repositions with the change of view of the three-dimensional model.

In FIG. 12A, the satellite image of the roof is used to derive a two-dimensional graph of the roof, where edges of the graph represent the edges of the roof. The edges define polygons that represent roof faces. From the two-dimensional spatial graph of the roof, the level edges are identified and are represented by orange line segments labelled "L" in FIGS. 12A and 12B. The edges that are not level edges are represented by white lines in FIG. 12A. Nodes in the two-dimensional spatial graph are circles in FIG. 12A. The pitch is determined for each roof face, explicitly or implicitly. A vector is calculated for each roof face to determine the azimuth, that is the geographic orientation, for each roof. These vectors, shown as yellow arrows in FIG. 12A, are approximately perpendicular to all level edges of their roof face and point in the "outwards" direction for their roof face. Subsequently, for each roof face, the height is determined for all nodes bordering the roof face, of which the height is unknown, according to Equation (1). The tilt of the roof face may be set explicitly or implicitly, such as according to Equation (2). The three-dimensional model illustrated in FIG. 12B is reconstructured according to the height calculated for all nodes as well as the geographic orientation for all roof faces.

Figure 12C:
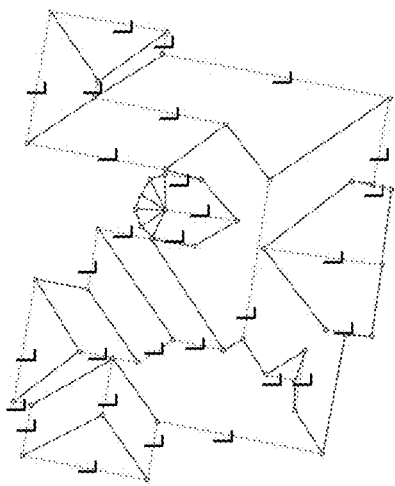
FIG. 12C is a two-dimensional spatial graph of the roof illustrated in FIG. 12A.
Figure 12D:
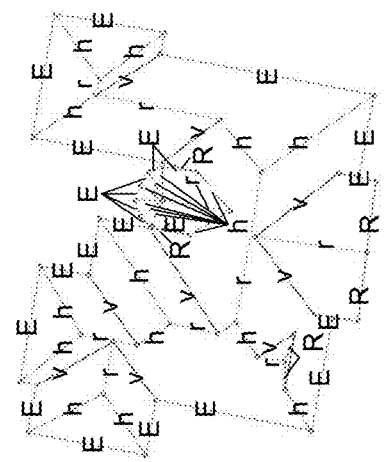
FIG. 12D shows the edge types assigned for the roof.
Figure 12E:
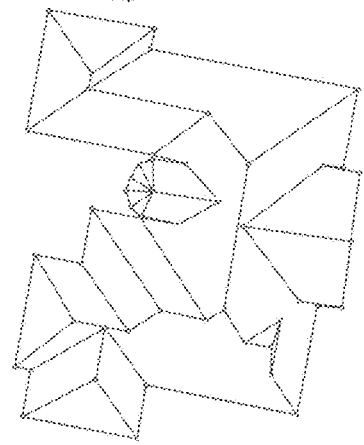
FIG. 12E shows the level edge detected for the roof.
Figure 12F:
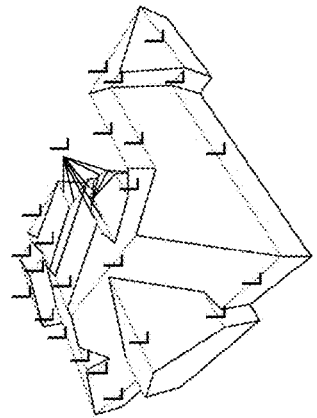
FIG. 12F illustrates the three-dimensional model reconstructed for the roof.
Figure 12G:
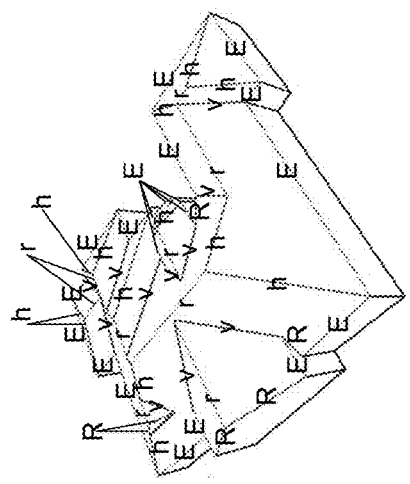
FIG. 12G illustrates the three-dimensional model with edge types assigned for the roof.
Figure 12H:
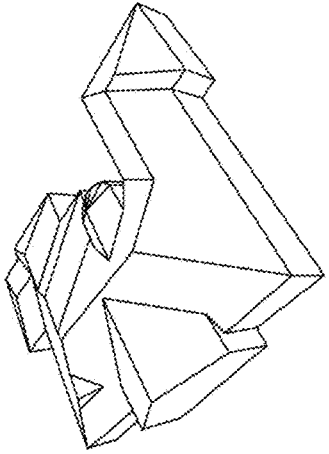
FIG. 12H illustrates the three-dimensional model with level edges detected for the roof.

FIG. 12C is a two-dimensional spatial graph of the roof illustrated in FIGS. 12A and 12B, FIG. 12D shows the edge types assigned for the roof, and FIG. 12E shows the level edges detected for the roof. FIG. 12F illustrates the three-dimensional model reconstructed for the building structure illustrated in FIGS. 12A and 12B, FIG. 12G illustrates the three-dimensional model with edge types assigned to the roof edges, and FIG. 12H illustrates the three-dimensional model with level edges detected for the roof. The three-dimensional model illustrated in FIG. 12G is reconstructured according to the method illustrated in FIG. 4 and FIG. 5, and the three-dimensional model illustrated in FIG. 12H is reconstructured according to the method illustrated in FIG. 9.

What is claimed is:

1. A computer-implemented method for constructing a three-dimensional model of a structure with a roof, comprising:
    accessing a two-dimensional spatial graph of a top view of the roof, the two-dimensional spatial graph comprising multiple nodes connected by graph edges, the graph edges representing roof edges of the roof and defining roof faces, the two-dimensional spatial graph drawn to scale with respect to the top view of the roof;
    identifying level edges from the graph edges by analyzing the two-dimensional spatial graph, a level edge connecting at least two nodes at a same height;
    determining pitches for roof faces based on the identified level edges, a pitch for a roof face being determined based on a height for one node bordering the roof face and a tilt for the roof face or based on heights for two or more nodes bordering the roof face;
    determining heights for the nodes according to the determined pitches for roof faces that border the nodes;
    generating the three-dimensional model of the structure based at least on the heights for the nodes; and
    providing the three-dimensional model for presentation to a user.

2. The computer-implemented method of claim 1, wherein identifying the level edges comprises:
    analyzing the two-dimensional spatial graph to identify exterior edges from the graph edges; and
    identifying exterior edges that border only one roof face as level edges.

3. The computer-implemented method of claim 2, wherein identifying the level edges further comprises:
    analyzing the two-dimensional spatial graph to identify graph edges parallel to level edges that are exterior edges; and
    identifying the parallel graph edges as level edges.

4. The computer-implemented method of claim 1, wherein determining the height for a node comprises identifying a tilt axis for the roof face, the tilt axis perpendicular to a tilt direction of the roof face and passing through a plane of the roof face.

5. The computer-implemented method of claim 1, further comprising determining geographic orientations for roof faces, the geographic orientations measured relative to a reference direction.

6. The computer-implemented method of claim 5, wherein determining geographic orientations for roof faces comprises calculating a vector for the roof face, the vector perpendicular to level edges bordering the roof face and pointing in an outwards direction from the roof face.

7. The computer-implemented method of claim 1, further comprising constructing the three-dimensional model of the structure according to a geographic orientation for each roof face.

8. The computer-implemented method of claim 7, further comprising identifying a texture of a roof face from satellite imagery and applying the texture of the roof face to the three-dimensional model of the structure.

9. The computer-implemented method of claim 1, further comprising determining a size of the structure according to a scale of or derived from a satellite image.

10. A non-transitory computer readable medium containing software instructions that, when executed by a computer system, cause the computer system to execute a method for constructing a three-dimensional model of a structure with a roof, the method comprising:
    accessing a two-dimensional spatial graph of a top view of the roof, the two-dimensional spatial graph comprising multiple nodes connected by graph edges, the graph edges representing roof edges of the roof and defining roof faces, the two-dimensional spatial graph drawn to scale with respect to the top view of the roof;
    identifying level edges from the graph edges by analyzing the two-dimensional spatial graph, a level edge connecting at least two nodes at a same height;
    determining pitches for roof faces based on the identified level edges, a pitch for a roof face being determined based on a height for one node bordering the roof face and a tilt for the roof face or based on heights for two or more nodes bordering the roof face;
    determining heights for the nodes according to the determined pitches for roof faces that border the nodes;
    generating the three-dimensional model of the structure based at least on the heights for the nodes; and providing the three-dimensional model for presentation to a user.

11. The non-transitory computer readable medium of claim 10, wherein identifying the level edges comprises:
analyzing the two-dimensional spatial graph to identify exterior edges from the graph edges: and
identifying exterior edges that border only one roof face as level edges.

12. The non-transitory computer readable medium of claim 11, wherein identifying the level edges further comprises:
analyzing the two-dimensional spatial graph to identify graph edges parallel to level edges that are exterior edges; and
identifying the parallel graph edges as level edges.

13. The non-transitory computer readable medium of claim 10, wherein determining the height for a node comprises identifying a tilt axis for the roof face, the tilt axis perpendicular to a tilt direction of the roof face and passing through a plane of the roof face.

14. The non-transitory computer readable medium of claim 10, wherein the method further comprises determining geographic orientations for roof faces, the geographic orientations measured relative to a reference direction.

15. The non-transitory computer readable medium of claim 14, wherein the method further comprises determining geographic orientations for roof faces comprises calculating a vector for the roof face, the vector perpendicular to level edges bordering the roof face and pointing in an outwards direction from the roof face.

16. The non-transitory computer readable medium of claim 10, wherein the method further comprises constructing the three-dimensional model of the structure according to a geographic orientation for each roof face.

17. A computer-implemented method for constructing a three-dimensional model of a structure with a roof, comprising:
accessing a two-dimensional spatial graph of a top view of the roof, the two-dimensional spatial graph comprising multiple nodes connected by graph edges, the graph edges representing roof edges of the roof and defining roof faces, the two-dimensional spatial graph drawn to scale with respect to the top view of the roof;
identifying level edges from the graph edges by analyzing a topology of the two-dimensional spatial graph, a level edge connecting at least two nodes at a same height;
determining pitches for roof faces based on the identified level edges;
determining heights for the nodes according to the determined pitches for roof faces that border the nodes;
generating the three-dimensional model of the structure based at least on the heights for the nodes; and
providing the three-dimensional model for presentation to a user.

18. The computer-implemented method of claim 17, wherein the pitch for a roof face is determined as an average roof pitch for a geographic area where the structure is located or for a building style determined for the structure.

19. A non-transitory computer readable medium containing software instructions that, when executed by a computer system, cause the computer system to execute a method for constructing a three-dimensional model of a structure with a roof, the method comprising:
accessing a two-dimensional spatial graph of a top view of the roof, the two-dimensional spatial graph comprising multiple nodes connected by graph edges, the graph edges representing roof edges of the roof and defining roof faces, the two-dimensional spatial graph drawn to scale with respect to the top view of the roof;
identifying level edges from the graph edges by analyzing a topology of the two-dimensional spatial graph, a level edge connecting at least two nodes at a same height;
determining pitches for roof faces based on the identified level edges;
determining heights for the nodes according to the determined pitches for roof faces that border the nodes;
generating the three-dimensional model of the structure based at least on the heights for the nodes; and
providing the three-dimensional model for presentation to a user.

20. The non-transitory computer readable medium of claim 19, wherein the pitch for a roof face is determined as an average roof pitch for a geographic area where the structure is located or for a building style determined for the structure.

* * * * *